United States Patent
Gu et al.

(10) Patent No.: US 10,026,818 B1
(45) Date of Patent: Jul. 17, 2018

(54) FIELD EFFECT TRANSISTOR STRUCTURE WITH RECESSED INTERLAYER DIELECTRIC AND METHOD

(71) Applicant: GLOBALFOUNDRIES INC., Grand Cayman (KY)

(72) Inventors: Sipeng Gu, Clifton Park, NY (US); Xusheng Wu, Ballston Lake, NY (US); Wenhe Lin, Saratoga Springs, NY (US); Jeffrey Chee, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/410,159

(22) Filed: Jan. 19, 2017

(51) Int. Cl.
| | |
|---|---|
| *H01L 29/66* | (2006.01) |
| *H01L 29/417* | (2006.01) |
| *H01L 21/321* | (2006.01) |
| *H01L 29/78* | (2006.01) |
| *H01L 29/08* | (2006.01) |
| *H01L 21/265* | (2006.01) |

(52) U.S. Cl.
CPC .. *H01L 29/41783* (2013.01); *H01L 21/26513* (2013.01); *H01L 21/3212* (2013.01); *H01L 29/0847* (2013.01); *H01L 29/6656* (2013.01); *H01L 29/66545* (2013.01); *H01L 29/78* (2013.01)

(58) Field of Classification Search
CPC ......... H01L 29/41783; H01L 29/66545; H01L 29/0847; H01L 21/3212; H01L 21/26513; H01L 29/78; H01L 29/6656
See application file for complete search history.

(56) References Cited

U.S. PATENT DOCUMENTS

| 6,887,769 | B2  | 5/2005  | Kellar et al. | |
|---|---|---|---|---|
| 8,030,197 | B2  | 10/2011 | Doyle et al. | |
| 8,048,752 | B2* | 11/2011 | Wu | ................ H01L 21/82346 |
| | | | | 257/E21.626 |
| 8,536,040 | B1* | 9/2013  | Park | ...................... H01L 29/49 |
| | | | | 257/E21.198 |
| 9,231,080 | B2  | 1/2016  | Horak et al. | |
| 2008/0116537 | A1 | 5/2008 | Adkisson et al. | |
| 2009/0014812 | A1* | 1/2009 | Wang | ............... H01L 21/82342 |
| | | | | 257/392 |
| 2010/0102394 | A1* | 4/2010 | Yamakawa | ....... H01L 21/82380 |
| | | | | 257/369 |

(Continued)

*Primary Examiner* — Bitew Dinke
(74) *Attorney, Agent, or Firm* — Gibb & Riley, LLC; Francois Pagette

(57) ABSTRACT

Disclosed are a field effect transistor (FET) and a FET formation method. In the FET, an interlayer dielectric (ILD) layer is positioned laterally adjacent to a sidewall spacer of a replacement metal gate and a cap layer covers the ILD layer, the sidewall spacer and the gate. However, during processing after the gate is formed but before the cap layer is formed, the ILD layer is polished and then recessed such that the top surface of the ILD layer is lower than the top surfaces of the sidewall spacer and the gate. The cap layer is then deposited such that the cap layer is, not only above the top surfaces of the ILD layer, sidewall spacer and gate, but also positioned laterally adjacent to a vertical surface of the sidewall spacer. Recessing the ILD layer prevents shorts between the gate and subsequently formed contacts to the FET source/drain regions.

16 Claims, 14 Drawing Sheets

(56) References Cited

U.S. PATENT DOCUMENTS

| | | | |
|---|---|---|---|
| 2014/0015104 A1* | 1/2014 | Su | H01L 21/225 |
| | | | 257/611 |
| 2014/0110794 A1 | 4/2014 | Xie et al. | |
| 2014/0231923 A1* | 8/2014 | Yin | H01L 29/66545 |
| | | | 257/369 |
| 2015/0108589 A1* | 4/2015 | Cheng | H01L 29/511 |
| | | | 257/411 |
| 2015/0194350 A1* | 7/2015 | Cai | H01L 21/0217 |
| | | | 257/369 |
| 2015/0214319 A1* | 7/2015 | Li | H01L 29/4966 |
| | | | 257/288 |
| 2016/0027689 A1* | 1/2016 | Wang | H01L 23/485 |
| | | | 257/774 |
| 2016/0148999 A1* | 5/2016 | Ok | H01L 29/0649 |
| | | | 257/387 |
| 2016/0163815 A1* | 6/2016 | Hoentschel | H01L 29/665 |
| | | | 257/379 |
| 2016/0343856 A1* | 11/2016 | Leobandung | H01L 23/535 |
| 2017/0103949 A1* | 4/2017 | Teng | H01L 21/283 |
| 2017/0162396 A1* | 6/2017 | Tsai | H01L 21/28247 |
| 2017/0162675 A1* | 6/2017 | Yim | H01L 21/0217 |
| 2017/0263604 A1* | 9/2017 | Lin | H01L 27/0886 |
| 2017/0278942 A1* | 9/2017 | Leobandung | H01L 29/665 |
| 2017/0317212 A1* | 11/2017 | Kim | H01L 21/764 |

* cited by examiner

FIELD EFFECT TRANSISTOR STRUCTURE WITH RECESSED INTERLAYER DIELECTRIC AND METHOD

FIELD OF THE INVENTION

The present invention relates to field effect transistors (FETs) and, more particularly, to to a FET structure and a method of forming the FET structure to avoid gate-to-contact shorts.

BACKGROUND

In field effect transistor (FET) processing, the replacement of conventional gates, which include a silicon oxide gate dielectric layer and a doped polysilicon gate conductor layer, with replacement metal gates, which include high-K gate dielectric layer(s) and metal gate conductor layer(s), has allowed for device scaling at the 32 nm node and beyond. However, the current techniques used to replace conventional gates with replacement metal gates can lead to gate-to-contact shorts and, more particularly, shorts (also referred to herein as stringers) that occur between a replacement metal gate and the adjacent contacts (also referred to herein as TS contacts or metal plugs) that extend to the FET source/drain regions. Such gate-to-contact shorts can, in turn, lead to device fails, particularly, at high operating voltages (e.g., as evidenced by the results of high voltage stress (HVS) testing).

SUMMARY

In view of the foregoing, disclosed herein are a field effect transistor (FET) and a method of forming the FET. In the FET, an interlayer dielectric (ILD) layer is positioned laterally immediately adjacent to a sidewall spacer of a replacement metal gate and a dielectric cap layer is above the ILD layer, the sidewall spacer and the replacement metal gate. However, during processing after the replacement metal gate is formed but before the dielectric cap layer is formed, the ILD layer is polished and then recessed such that the top surface of the ILD layer is lower than the top surfaces of the sidewall spacer and replacement metal gate. The dielectric cap layer is then deposited such that a portion of the dielectric cap layer is, not only above the ILD layer, but also positioned laterally immediately adjacent to a vertical surface of the sidewall spacer. Recessing the ILD layer removes any metal residue from the replacement metal gate remaining on the top surface of the ILD layer following polishing. Recessing the ILD layer also ensures that metal that may protrude into the interface between the ILD layer and the dielectric cap layer (e.g., through pin-hole defects in subsequently formed contacts to the FET source/drain regions) is blocked by the sidewall spacer from contacting the replacement metal gate because the top surface of the ILD layer is lower than the top surfaces of the sidewall spacer and replacement metal gate. Thus, shorts between the replacement metal gate and the subsequently formed contacts to the FET source/drain regions are effectively prevented.

More particularly, disclosed herein is a field effect transistor (FET). The FET can have source/drain regions and a channel region positioned laterally between the source/drain regions. The FET can further have a gate and, particularly, a replacement metal gate adjacent to the channel region. A sidewall spacer can be positioned laterally adjacent to a sidewall of the replacement metal gate and an interlayer dielectric (ILD) layer can be positioned laterally adjacent to the sidewall spacer. The top surface of the ILD layer can specifically be at a lower level than the top surfaces of the replacement metal gate and the sidewall spacer. A dielectric cap layer can cover the ILD layer, the sidewall spacer and the replacement metal gate. Since the top surface of the ILD layer is at a lower level than the top surfaces of the sidewall spacer and replacement metal gate, the dielectric cap layer will have a portion that is above the ILD layer and also positioned laterally immediately adjacent to an outer vertical surface of an upper corner of the sidewall spacer.

Also disclosed herein are embodiments of a method of forming the above-described field effect transistor (FET). Generally, in the method embodiments, a sacrificial gate can be removed, thereby creating a gate opening that extends vertically through an interlayer dielectric (ILD) layer and is physically separated from the interlayer dielectric layer by a sidewall spacer. After the sacrificial gate is removed, a replacement metal gate can be formed in the gate opening adjacent to a channel region and a polishing process can be performed so that top surfaces of the ILD layer, the sidewall spacer and the replacement metal gate are approximately level. Next, the ILD layer can be recessed relative to the sidewall spacer and the replacement metal gate. Those skilled in the art will recognize that the process used to recess the ILD layer relative to the sidewall spacer and the replacement metal gate will vary depending upon the materials used for these different features. Once the ILD layer is recessed, a dielectric cap layer can be deposited (e.g., conformally) so as to cover exposed surfaces of the ILD layer, the sidewall spacer and the replacement metal gate. Since the top surface of the ILD layer is at a lower level than the top surfaces of the sidewall spacer and replacement metal gate, the dielectric cap layer will have a portion that is above the ILD layer and also positioned laterally immediately adjacent to an outer vertical surface of an upper corner of the sidewall spacer.

One particular method embodiment can incorporate a silicon dioxide interlayer dielectric (ILD) layer, which is recessed after replacement metal gate formation using a chemical oxide removal (COR) process. More particularly, in an embodiment of the method, a sacrificial gate can be removed, thereby creating a gate opening that extends vertically through an interlayer dielectric layer (e.g., a silicon dioxide ILD layer) and is physically separated from the ILD layer by a sidewall spacer, which is made of a different dielectric material than the ILD layer. After the sacrificial gate is removed, a replacement metal gate can be formed in the gate opening adjacent to a channel region and a polishing process can be performed so that top surfaces of the interlayer dielectric layer, the sidewall spacer and the replacement metal gate are approximately level. Next, the ILD layer and, particularly, the silicon dioxide ILD layer can be recessed relative to the sidewall spacer and the replacement metal using a chemical oxide removal (COR) process. Once the ILD layer is recessed, a dielectric cap layer can be deposited (e.g., conformally) so as to cover exposed surfaces of the ILD layer, the sidewall spacer and the replacement metal gate. Since the top surface of the ILD layer is at a lower level than the top surfaces of the sidewall spacer and replacement metal gate, the dielectric cap layer will have a portion that is above the ILD layer and also positioned laterally immediately adjacent to an outer vertical surface of an upper corner of the sidewall spacer.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1A:
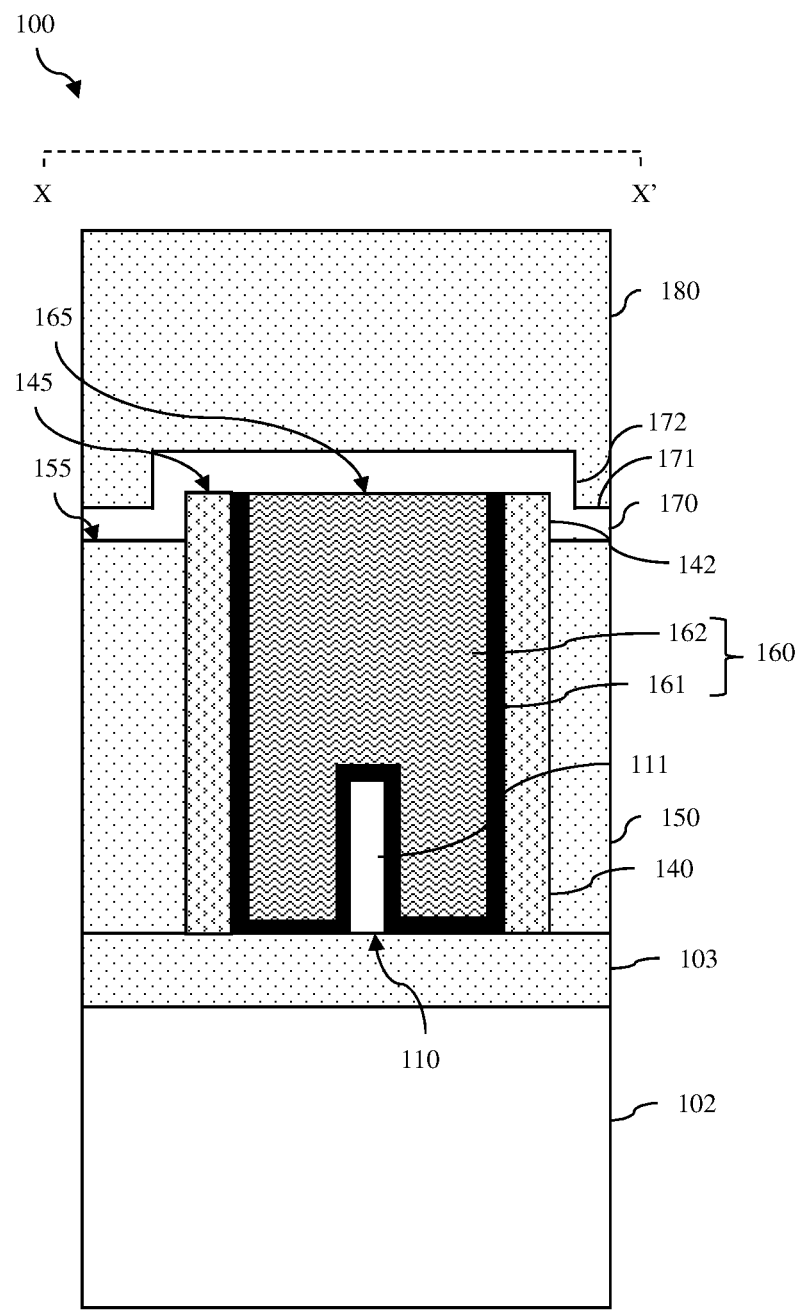
FIGS. 1A-1B are different cross-section diagrams of an embodiment of a field effect transistor (FET) disclosed herein.

As mentioned above, in field effect transistor (FET) processing, the replacement of conventional gates, which include a silicon oxide gate dielectric layer and a doped polysilicon gate conductor layer, with replacement metal gates, which include high-K gate dielectric layer(s) and metal gate conductor layer(s), has allowed for device scaling at the 32 nm node and beyond. However, the current techniques used to replace conventional gates with replacement metal gates can lead to gate-to-contact shorts and, more particularly, shorts (also referred to herein as stringers) that occur between a replacement metal gate and the adjacent contacts (also referred to herein as TS contacts or metal plugs) that extend to the FET source/drain regions. Multiple processing conditions alone and/or in combination can cause these gate-to-contact shorts. For example, typically, following formation of a replacement metal gate, a chemical mechanical polishing (CMP) process is performed in order to remove gate metal(s) from above an adjacent gate sidewall spacer and an interlayer dielectric (ILD) layer. Those skilled in the art will recognize that a chemical mechanical polishing process is a process that employs a combination of a chemical slurry and an abrasive polishing processes using a polishing pad to planarize (i.e., smooth) a surface. As a result of this polishing process, the top surfaces of the replacement metal gate, the adjacent gate sidewall spacer and the ILD layer are approximately level. A thin dielectric cap layer (e.g., a thin silicon nitride cap layer) is then deposited over the ILD layer, the gate sidewall spacer and the replacement metal gate and an additional ILD layer is deposited on the dielectric cap layer. Subsequently, contact openings are patterned and etched through the additional ILD layer, the dielectric cap layer and the ILD layer to source/drain regions. These contact openings are, optionally, lined and filled with contact metal(s) to form source/drain contacts.

Unfortunately, the CMP process that is used to remove the gate metal(s) from above the gate sidewall spacer and the ILD layer (along with any post-CMP clean process) may not be able to completely remove all metal residues and, thus, some gate metal may remain between the ILD layer and the dielectric cap layer in the resulting FET. The gate metal on the top surface of the ILD layer (referred to as a stringer) can interconnect the replacement metal gate and the source/drain contact(s). Additionally, this same CMP process may cause micro-scratch defects on the top surface of the ILD layer, due to the abrasive nature of the mechanical polishing. These micro-scratch defects can facilitate electromigration of gate metal(s) from the replacement metal gate or contact metal(s) from the adjacent contacts along the interface between the ILD layer and the dielectric cap layer. Finally, pin hole defects that may occur in a metal liner in the contact openings may allow metal fill material from the contacts to protrude into the interface between the ILD layer and the dielectric cap layer and this metal fill material can, like the stringers described above, interconnect the replacement metal gate and source/drain contact(s). Such gate-to-contact shorts can, in turn, lead to device fails, particularly, at high operating voltages (e.g., as evidenced by the results of high voltage stress (HVS) testing).

In view of the foregoing, disclosed herein are a field effect transistor (FET) and a method of forming the FET. In the FET, an interlayer dielectric (ILD) layer is positioned laterally immediately adjacent to a sidewall spacer of a replacement metal gate and a dielectric cap layer is above the ILD layer, the sidewall spacer and the replacement metal gate. However, during processing after the replacement metal gate is formed but before the dielectric cap layer is formed, the ILD layer is polished and then recessed such that the top surface of the ILD layer is lower than the top surfaces of the sidewall spacer and replacement metal gate. The dielectric cap layer is then deposited such that a portion of the dielectric cap layer is, not only above the ILD layer, but also positioned laterally immediately adjacent to a vertical surface of the sidewall spacer. Recessing the ILD layer removes any metal residue from the replacement metal gate remaining on the top surface of the ILD layer following polishing. Recessing the ILD layer also ensures that any metal that may protrude into the interface between the ILD layer and the dielectric cap layer (e.g., through pin-hole defects in subsequently formed contacts to the FET source/drain regions) is blocked by the sidewall spacer from contacting the replacement metal gate because the top surface of the ILD layer is lower than the top surfaces of the sidewall spacer and replacement metal gate. Thus, shorts between the replacement metal gate and the subsequently formed contacts to the FET source/drain regions are effectively prevented.

Figure 1B:
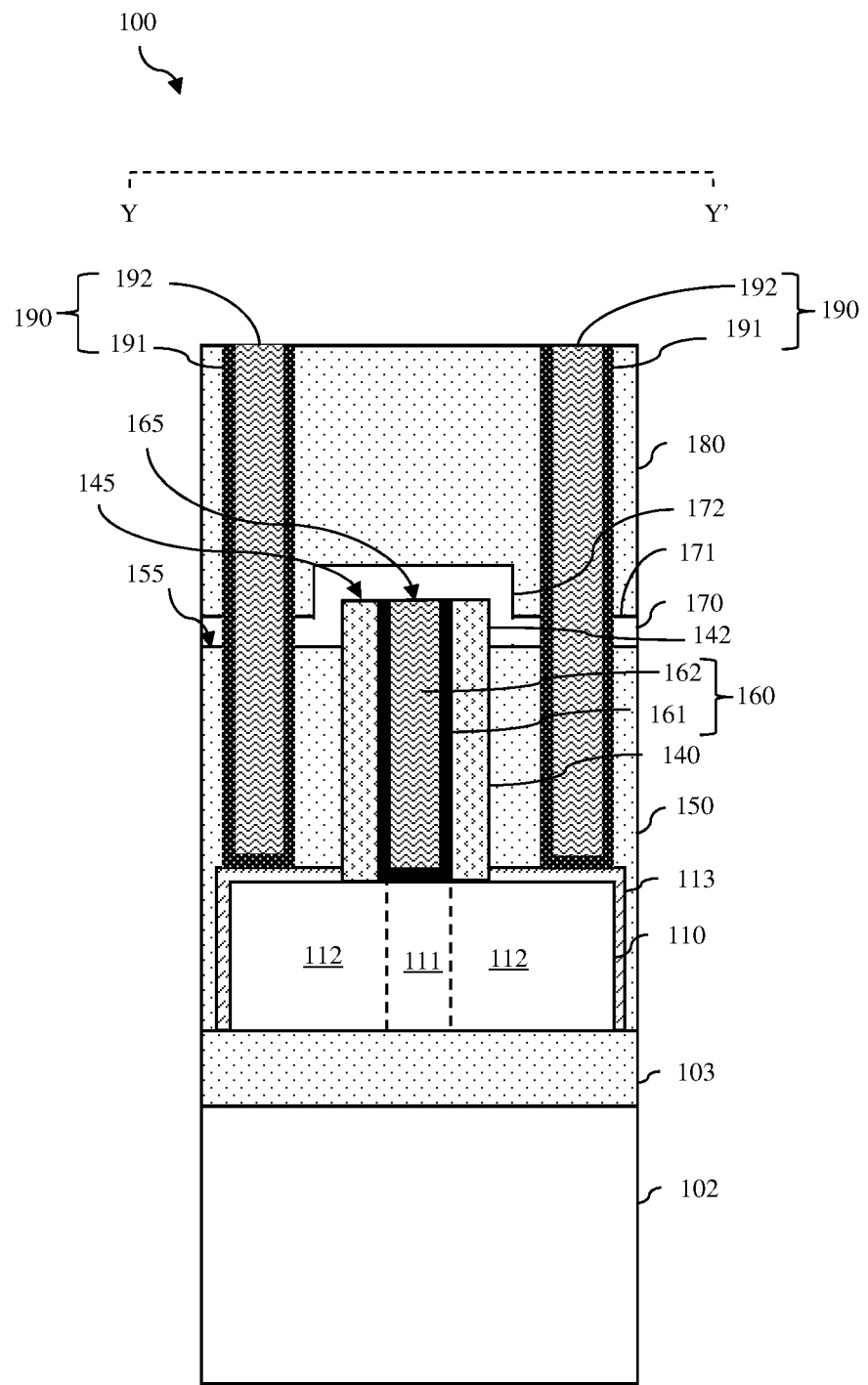

More particularly, referring to the different cross-section diagrams of FIGS. 1A-1B, disclosed herein are embodiments of a field effect transistor (FET) 100. The cross-section X-X' of FIG. 1A cuts across the width of the FET 100 at the channel region and the cross-section Y-Y' of FIG. 1B cuts across the length of the FET 100.

The FET 100 can be a semiconductor-on-insulator structure (e.g., a silicon-on-insulator (SOI) structure). That is, the FET 100 can be formed using a semiconductor layer of a wafer, which includes a semiconductor substrate 102 (e.g., a silicon substrate), an insulator layer 103 (e.g., a buried oxide (BOX) layer) on the semiconductor substrate 102 and a semiconductor layer (e.g., a silicon layer) on the insulator layer 103. Alternatively, the FET 100 can be a bulk semiconductor structure. That is, the FET 100 can be formed using an upper portion of the bulk semiconductor substrate (e.g., a bulk silicon substrate), which is electrically isolated from a lower portion of the semiconductor substrate (e.g., by one or more well regions, one or more trench isolation regions, etc.). For purposes of illustration, the FET is illustrated as a semiconductor-on-insulator structure.

The FET 100 can be a non-planar FET, such as fin-type FET (finFET) (also referred to herein as dual gate FET) or tri-gate FET. Alternatively, the FET 100 can be a planar FET. For purposes of illustration, the FET 100 is illustrated in FIGS. 1A-1B as a finFET.

In any case, the FET 100 can include a semiconductor body 110. Those skilled in the art will recognize that, for a finFET, the semiconductor body 110 can be a fin-shaped semiconductor body (i.e., a relatively thin rectangular semiconductor body, also referred to herein as a semiconductor fin). The semiconductor body 110 can include source/drain regions 112 and a channel region 111 positioned laterally between the source/drain regions 112. The channel region 111 can be doped, for example, with a first dopant so as to have a first type conductivity at a relatively low conductivity level. The source/drain regions 112 can be doped, for example, with a second dopant so as to have a second type conductivity at a relatively high conductivity level. Optionally, epitaxial semiconductor material (e.g., epitaxial silicon or any other suitable epitaxial semiconductor material) can be grown on the source/drain regions 112, thereby forming raised epitaxial source/drain regions 113 (as shown). The epitaxial semiconductor material can be in-situ doped or subsequently implanted so that the raised epitaxial source/drain regions 113 have the second type conductivity at a relatively high conductivity level. Optionally, the semiconductor body 110 can be recessed at the source/drain regions 112 (i.e., the semiconductor body 110 can have recessed source/drain regions 112) and the epitaxial source/drain regions 113 can be on the recessed source/drain regions (not shown).

The FET 100 can further have a gate 160 adjacent to the semiconductor body 110 at the channel region 111. A sidewall spacer 140 can be positioned laterally immediately adjacent to a sidewall of the gate 160. An interlayer dielectric (ILD) layer 150 can be positioned laterally immediately adjacent to the sidewall spacer 140. That is, the gate 160 and the ILD layer 150 are on opposing sides of and in contact with the sidewall spacer 140.

More specifically, a gate 160 and, particularly, a replacement metal gate can be adjacent to the semiconductor body 110 at the channel region 111. The replacement metal gate 160 can include a conformal high-k gate dielectric layer 161 that lines a gate opening such that it is immediately adjacent to the channel region 111. In the case of a finFET, this high-k gate dielectric layer 161 can specifically be adjacent to the opposing sides and over the top surface of the semiconductor body 110 at the channel region 111. The replacement metal gate 160 can further include one or more metal layers 162 on the high-K gate dielectric layer 161. For example, the metal layers 162 can include a conformal work function metal immediately adjacent to the high-k gate dielectric layer 161 and a fill metal on the work function metal.

Those skilled in the art will recognize that the materials and thicknesses of the dielectric and metal layers used for replacement metal gate can be preselected to achieve desired work functions given the conductivity type of the FET. Exemplary high-K dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). The optimal work function for a gate conductor of an N-type FET will be, for example, between 3.9 eV and about 4.2 eV. Exemplary metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The optimal work function for a gate conductor of a P-type FET will be, for example, between about 4.9 eV and about 5.2 eV. Exemplary metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). Exemplary fill metals include, but are not limited to, tungsten and aluminum.

The FET 100 can further include a sidewall spacer 140 positioned immediately adjacent to a sidewall of the replacement metal gate 160 such that the sidewall spacer 140 laterally surrounds the replacement metal gate 160. The sidewall spacer 140 can be a dielectric sidewall spacer. For example, the sidewall spacer 140 can be made of silicon nitride. Alternatively, the sidewall spacer 140 can be made of silicon carbon nitride, silicon boron carbon nitride or other suitable dielectric material.

The FET 100 can further include an interlayer dielectric (ILD) layer 150 positioned immediately adjacent to the sidewall spacer 140 opposite the replacement metal gate 160 such that the ILD layer 150 laterally surrounds the sidewall spacer 140 and is physically separated from the replacement metal gate 160 by the sidewall spacer 140. The ILD layer 150 can be a different dielectric material than the sidewall spacer 140. For example, the ILD layer 150 can be a silicon dioxide ILD layer. Alternatively, the ILD layer 150 can be made of any other suitable ILD material (e.g., borophosphosilicate glass (BPSG), tetraethyl orthosilicate (TEOS), fluorinated tetraethyl orthosilicate (FTEOS), etc.).

In any case, the top surface 155 of the ILD layer 150 can specifically be at a lower level than the top surfaces 165 and 145 of the replacement metal gate 160 and the sidewall spacer 140, respectively, relative to the semiconductor substrate 102. That is, the top surface 155 of the ILD layer 150 can be recessed (e.g., by a distance of approximately 2-4 nm) so that the top surface 155 of the ILD layer 150 is not co-planar with the top surfaces 165 and 145 of the replacement metal gate 160 and the sidewall spacer 140 and, more specifically, so that the distance between the semiconductor substrate 102 and the top surface of 155 of the ILD layer 150 is less than the distances between the semiconductor substrate 102 and the top surfaces 165 and 145 of the replacement metal gate 160 and the sidewall spacer. As discussed in greater detail below with regard to the method embodiments, due to the process used to recess the top surface 155 of the ILD layer 150, any metal residue remaining on the top surface 155 following replacement metal gate 160 formation will be removed and this top surface 155 will be devoid of micro-scratches, which can facilitate electromigration of metal.

The FET 100 can further include a dielectric cap layer 170 that covers the ILD layer 150, the sidewall spacer 140 and the replacement metal gate 160. The dielectric cap layer 170 can be a conformal dielectric cap layer having an essentially uniform thickness, as illustrated. Alternatively, the dielectric cap layer 170 can be a blanket dielectric cap layer, which is polished so as to have a predetermined thickness above the top surface 165 of the replacement metal gate 160 (not shown). The dielectric cap layer 170 can be a different dielectric material than the ILD layer 150. For example, the dielectric cap layer 170 can be made of silicon nitride. Alternatively, the dielectric cap layer 170 can be made of silicon carbon nitride, silicon boron carbon nitride or other suitable dielectric material. In any case, since the top surface 155 of the ILD layer 150 is at a lower level than the top surfaces 145 and 165 of the sidewall spacer 140 and replacement metal gate 160, respectively, the dielectric cap layer 170 will have a portion 171 that is above the ILD layer 150 and also positioned laterally immediately adjacent to an outer vertical surface 142 of an upper corner of the sidewall spacer 140.

The FET 100 can further include an additional interlayer dielectric (ILD) layer 180 over the dielectric cap layer 170. The additional ILD layer 180 can be a silicon dioxide ILD layer. Alternatively, the additional ILD layer 180 can be made of any other suitable ILD material (e.g., borophosphosilicate glass (BPSG), tetraethyl orthosilicate (TEOS), fluorinated tetraethyl orthosilicate (FTEOS), etc.).

The FET 100 can further include contacts 190 that extend vertically through the additional ILD layer 180, the dielectric cap layer 170 and the ILD layer 150 to source/drain regions 112 (or, if applicable, the raised epitaxial source/drain regions 113). Specifically, contact openings can extend vertically through the additional ILD layer 180, the dielectric cap layer 170 and the ILD layer 150, landing on the source/drain regions 112 (or, if applicable, the raised epitaxial source/drain regions 113). The contact openings can, optionally, be lined with a contact liner 191 and filled with a fill metal 192, thereby forming the contacts 190. The optional contact liner 191 can be a single conformal layer (e.g., an adhesive layer or a barrier layer) that lines the contact openings or multiple conformal layers (e.g., an adhesive layer and a barrier layer on the adhesive layer) that line the contact openings. For example, the optional contact liner 191 can include a conformal titanium adhesive layer and/or a conformal titanium nitride barrier layer. Alternatively, the optional contact liner 191 can include any other suitable conformal adhesive and/or barrier layers. The fill metal 192 can be, for example, tungsten, aluminum, copper, or cobalt, or alloys thereof.

In the above-described FET 100, since the top surface 155 of the ILD layer 150 is devoid of micro-scratches, electromigration of metal along the interface between the ILD layer 150 and the dielectric cap layer 170 is inhibited. Furthermore, since the top surface 155 of the ILD layer 150 is at a lower level than the top surfaces 145 and 165 of the sidewall spacer 140 and replacement metal gate 160, respectively, such that the interface between the ILD layer 150 and the dielectric cap layer 170 is below the level of the top surface 165 of the replacement metal gate, movement of metal (e.g., due to electromigration or other causes) from the replacement metal gate 160 to the contacts 190 or vice versa along this interface is blocked. For example, fill metal 192 from the contacts 190 may protrude into the interface between the ILD layer 150 and the dielectric cap layer 170 through pin-hole defects in the contact liner 191; however, this fill metal 192 will be blocked from contacting the replacement metal gate 160 by the outer vertical surface 142 of the sidewall spacer 140. Similarly, metal 162 from the replacement metal gate 160 may electromigrate over the sidewall spacer 140 toward the contacts 190; however, the vertical portion 172 of the dielectric cap layer 170 will block further electromigration of this metal 162.

Figure 2:
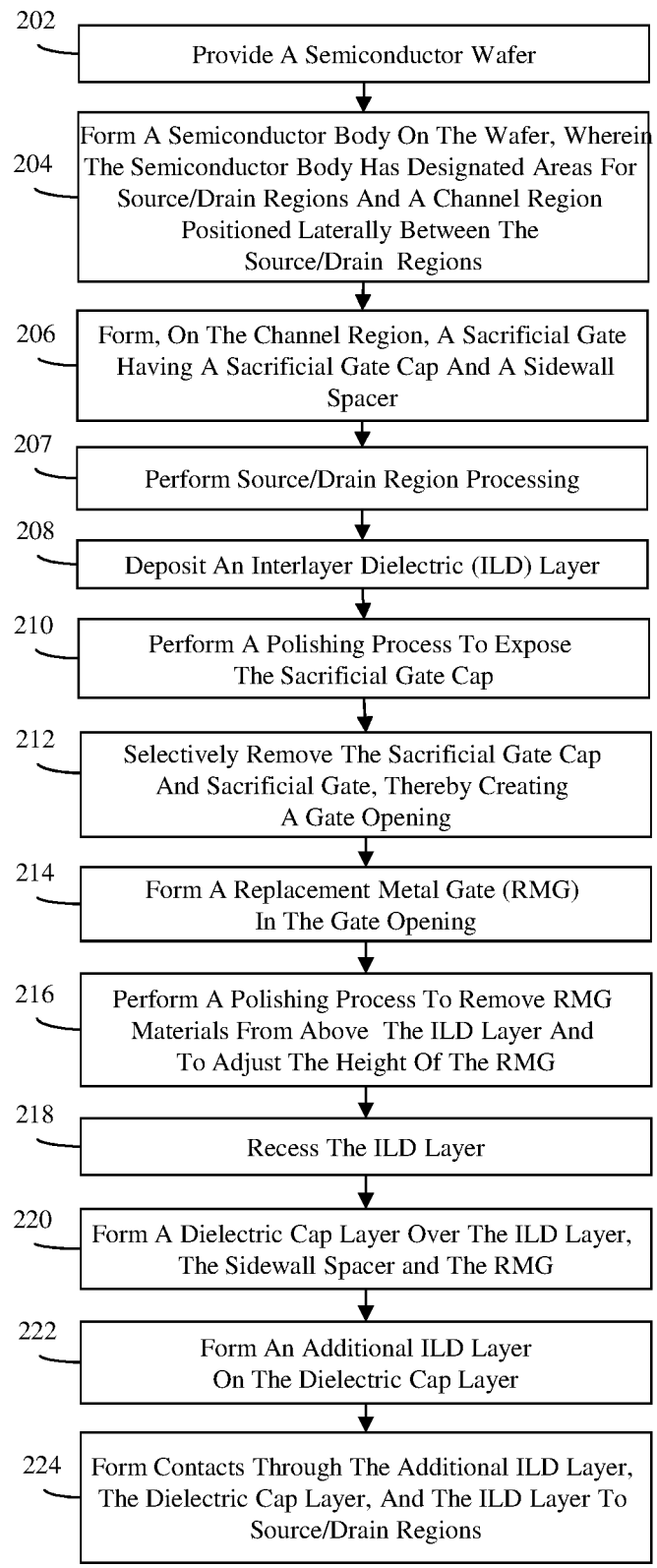
FIG. 2 is a flow diagram illustrating a method of forming the disclosed field effect transistor.

Referring to the flow diagram of FIG. 2, also disclosed herein are embodiments of a method of forming the above-described field effect transistor (FET).

Figure 3:
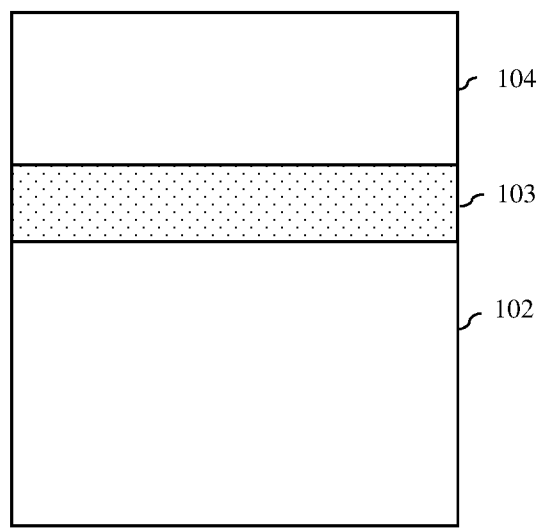
FIG. 3 is a cross-section diagram illustrating a partially completed field effect transistor formed according to the method of FIG. 2.

In the method embodiments, a semiconductor wafer can be provided (202, see FIG. 3). The semiconductor wafer can be a semiconductor-on-insulator wafer (e.g., a silicon-on-insulator (SOI) wafer). Such a semiconductor-on-insulator wafer can include a semiconductor substrate 102 (e.g., a silicon substrate), an insulator layer 103 (e.g., a buried oxide (BOX) layer) on the semiconductor substrate 102 and a semiconductor layer 104 (e.g., a silicon layer) on the insulator layer 103. Alternatively, the semiconductor wafer can be a bulk semiconductor wafer (e.g., a bulk silicon wafer).

Figure 4:
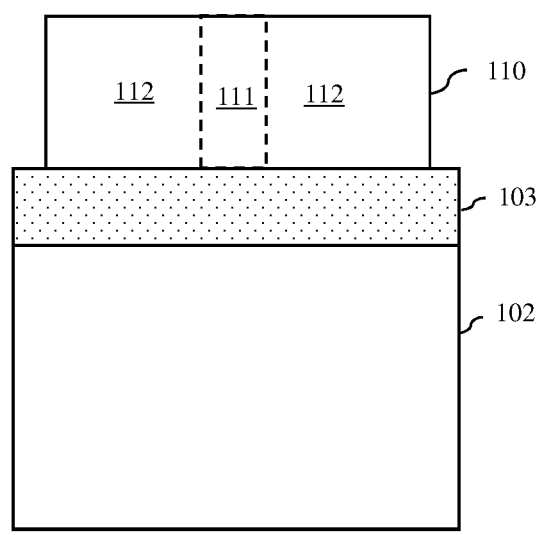
FIG. 4 is a cross-section diagram illustrating a partially completed field effect transistor formed according to the method of FIG. 2.

A semiconductor body 110 can be formed on the semiconductor wafer (204, see FIG. 4). For example, a semiconductor body 110 can be formed using the semiconductor layer of a semiconductor-on-insulator wafer, as illustrated. Alternatively, the semiconductor body can be formed using an upper portion of the bulk semiconductor substrate (e.g., a bulk silicon substrate), which is electrically isolated from a lower portion of the semiconductor substrate (e.g., by one or more well regions, one or more trench isolation regions, etc.). In any case, as mentioned above, the FET 100, which is formed according to the disclosed method, can be a non-planar FET, such as fin-type FET (finFET) (also referred to herein as dual gate FET) or tri-gate FET. Alternatively, this FET 100 can be a planar FET. For purposes of illustration, the method embodiments are described below and illustrated in the Figures with respect to the formation of a finFET. Those skilled in the art will recognize that, for a finFET, the semiconductor body 110 can be a fin-shaped semiconductor body (i.e., a relatively thin rectangular semiconductor body, also referred to herein as a semiconductor fin). Techniques for forming fin-shaped semiconductor bodies (e.g., lithographic patterning techniques or sidewall image transfer techniques) are well known in the art and, thus, the details have been omitted from this specification in order to allow the reader to focus on the salient aspects of the disclosed method.

It should be noted that the semiconductor body 110 can have areas designated for source/drain regions 112 and for a channel region 111 positioned laterally between the source/drain regions 112. The semiconductor body 110 can be appropriately doped with a first dopant, either before or after formation of the semiconductor body, so that the channel region 111 has a first type conductivity.

Figure 5A:
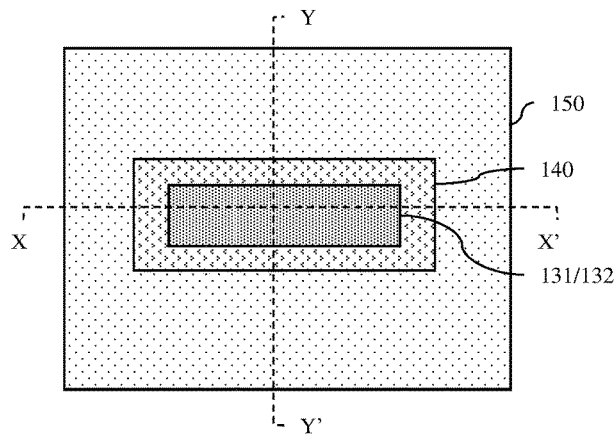
FIG. 5A is a top view diagram and FIGS. 5B-5C are different cross-section diagrams illustrating a partially completed field effect transistor formed according to the method of FIG. 2.
Figure 5B:
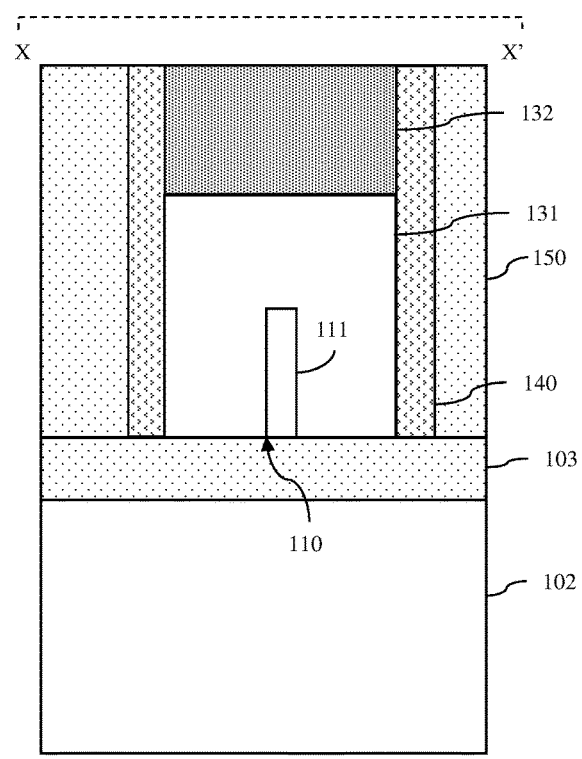
Figure 5C:
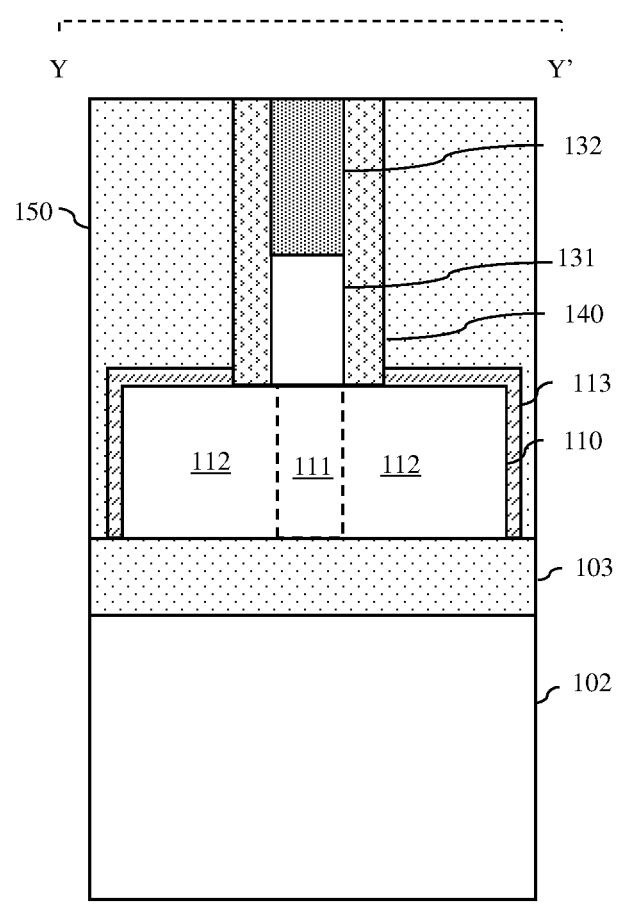

Next, a sacrificial gate 131 with a sacrificial gate cap 132 can be formed adjacent to the semiconductor body 110 at the channel region 111 (206, see FIGS. 5A-5C). For example, a first sacrificial layer can be formed over the semiconductor body 110 and a second sacrificial layer, which is different from the first sacrificial layer, can be formed on the first sacrificial layer. The first and second sacrificial layers can be patterned and etched to form a sacrificial gate 131 with a sacrificial gate cap 132, wherein the sacrificial gate 131 is adjacent to the channel region 111. In the case of a non-planar FET, as illustrated, the sacrificial gate 131 can be immediately adjacent to the opposing sidewalls of the semiconductor body 110 at the channel region 111 and can further extend over the top surface of the semiconductor body 110 at the channel region 111.

Subsequently, a sidewall spacer 140 and, particularly, a dielectric sidewall spacer can be formed on the sidewalls of the sacrificial gate 131. That is, a relatively thin conformal dielectric spacer layer can be deposited over the sacrificial gate/gate cap 131-132 and further over exposed source/drain regions 112 of the semiconductor body 110 that extend laterally beyond the sacrificial gate 131. For example, dielectric spacer layer can be a silicon nitride layer. Alternatively, the dielectric spacer layer can be a layer of silicon carbon nitride, silicon boron carbon nitride or other suitable dielectric material. Then, a directional etch process can be performed so as to remove the conformal dielectric layer from horizontal surfaces and from the sidewalls of the source/drain regions 112 of the semiconductor body 110. Those skilled in the art will recognize that the height of the sacrificial gate cap 132 should be equal to or greater than the height of the semiconductor body 110 so that the conformal dielectric layer can be removed from the sidewalls of the source/drain regions 112 without exposing the sidewalls of the sacrificial gate 131.

Following sidewall spacer 140 formation, source/drain processing can be performed (207, see FIGS. 5A-5C). Specifically, a dopant implant process can be performed so that the source/drain regions 112 are doped with a second dopant so as to have a second type conductivity at a relatively high conductivity level. Additionally or alternatively, epitaxial semiconductor material (e.g., epitaxial silicon or any other suitable epitaxial semiconductor material) can be deposited on exposed portions of the semiconductor body 110 (i.e., on the source/drain regions 112) to form raised epitaxial source/drain regions 113. The epitaxial semiconductor material can be in-situ doped or subsequently implanted so that the raised epitaxial source/drain regions 113 have the second type conductivity at a relatively high conductivity level. Optionally, before depositing the epitaxial semiconductor material, as described above, the source/drain regions 112 can be recessed (not shown), thereby ensuring that the source/drain regions 112 and the raised epitaxial source/drain regions 113 will be doped so as to have the desired conductivity type and level.

Next, an interlayer dielectric (ILD) layer 150 can be formed over the partially completed structure (208, see FIGS. 5A-5C). Specifically, a blanket ILD layer 150 can be deposited so as to cover the sacrificial gate cap 132 and sidewall spacer 140 on the sacrificial gate 131 and so as to cover each source/drain region 112 (or raised epitaxial source/drain region 113, if applicable). The ILD layer 150 can be a silicon dioxide ILD layer. Alternatively, the ILD layer 150 can be made of any other suitable ILD material (e.g., borophosphosilicate glass (BPSG), tetraethyl orthosilicate (TEOS), fluorinated tetraethyl orthosilicate (FTEOS), etc.). A polishing process and, particularly, a chemical mechanical polishing (CMP) process can then be performed in order to expose the top surfaces of the sacrificial gate cap 132 and the adjacent sidewall spacer 140 (210, see FIGS. 5A-5C).

Figure 6A:
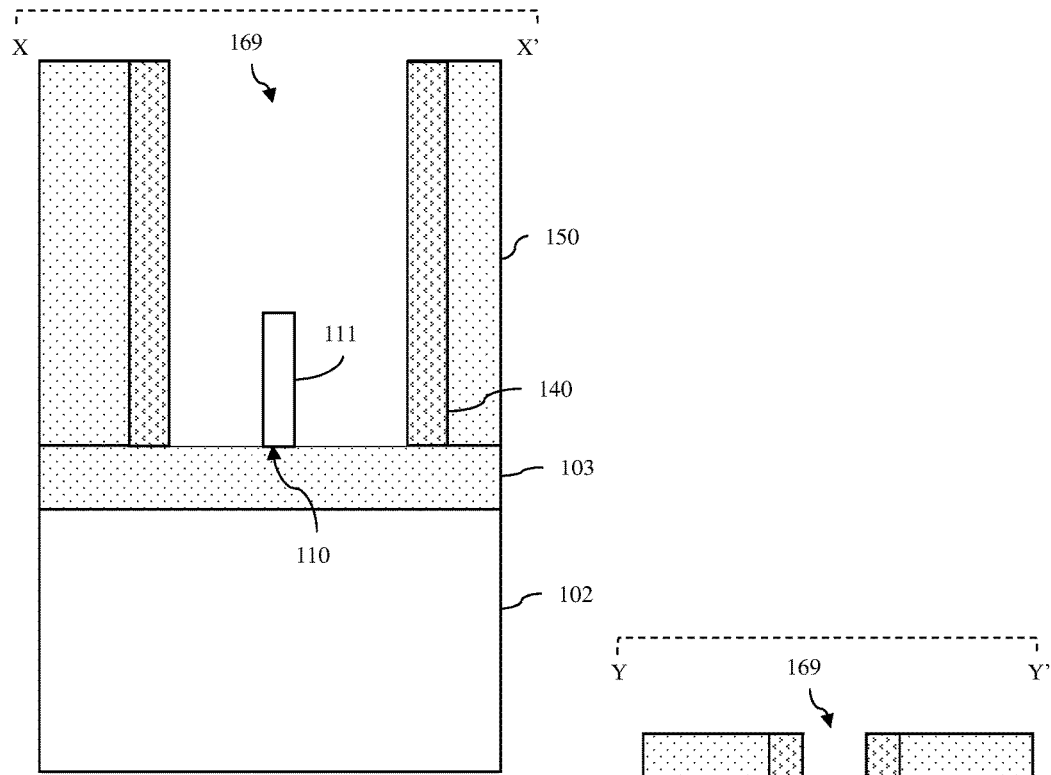
FIGS. 6A-6B are different cross-section diagrams illustrating a partially completed field effect transistor formed according to the method of FIG. 2.
Figure 6B:
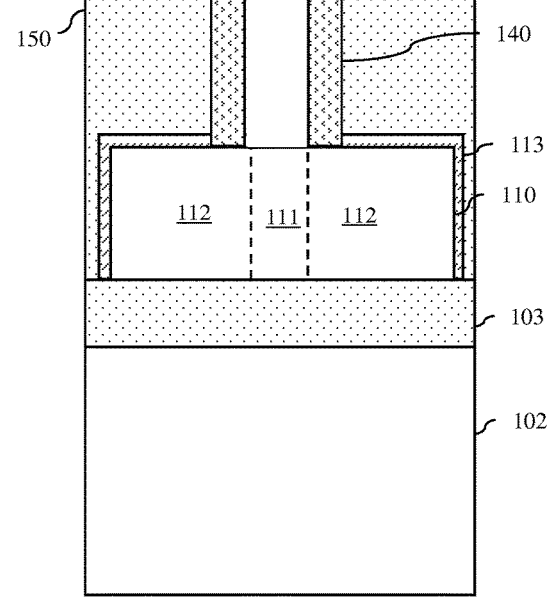

The sacrificial gate cap 132 and the sacrificial gate 131 below can then be selectively removed, thereby creating a gate opening 169 (212, see FIGS. 6A-6B). Specifically, the sacrificial material of the sacrificial gate cap 132 and the sacrificial gate 131 can be selectively etched over the dielectric material used for the sidewall spacer 140 and the ILD layer 150 (see FIGS. 7A-7B). Removal of the sacrificial gate cap 132 and the sacrificial gate 131 below will create a gate opening 169 in the ILD layer 150 and this gate opening 169 will have sidewalls lined with the sidewall spacer 140.

Figure 7A:
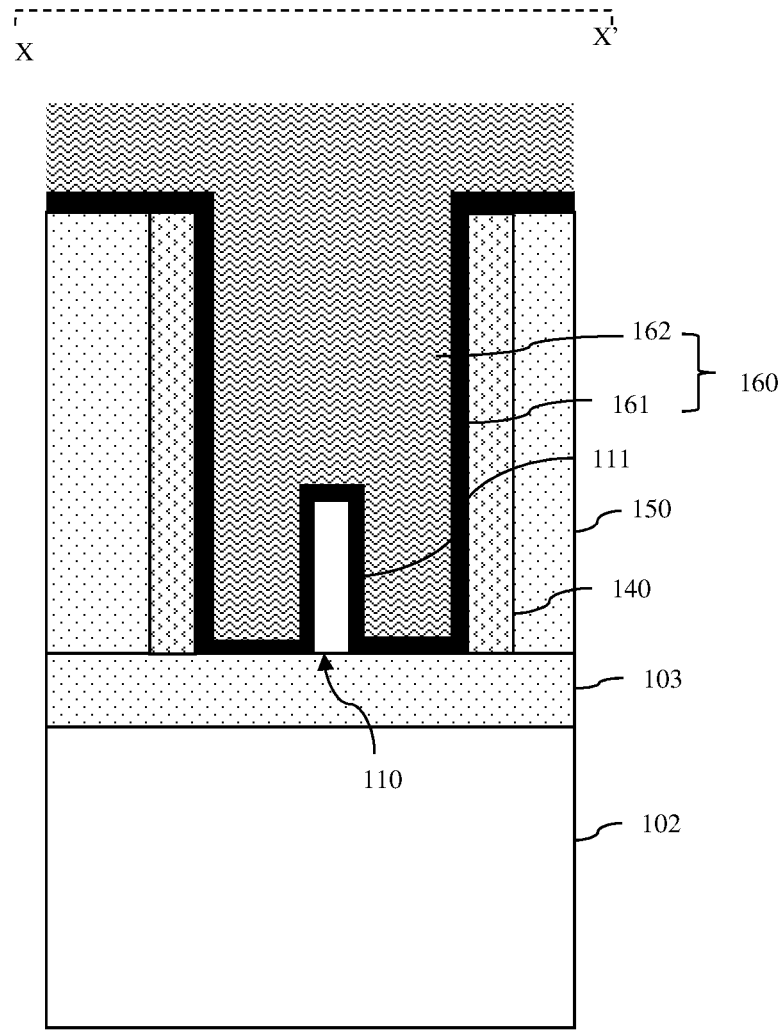
FIGS. 7A-7B are different cross-section diagrams illustrating a partially completed field effect transistor formed according to the method of FIG. 2.
Figure 7B:
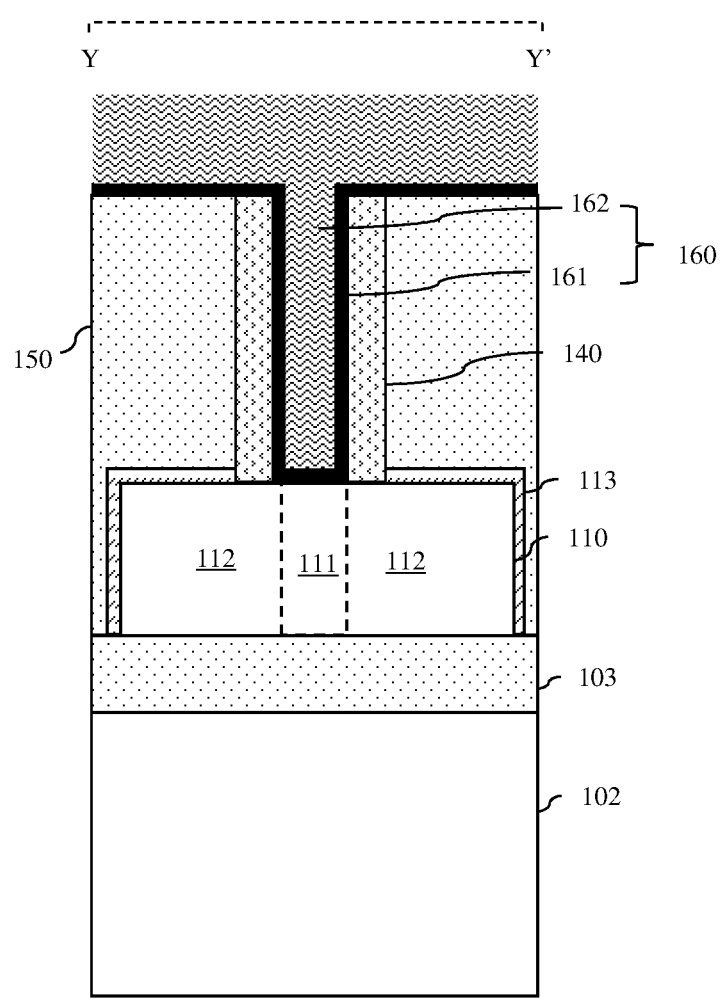

A replacement metal gate 160 can then be formed in the gate opening 169 adjacent to the channel region 111 (e.g., above the top surface and positioned laterally adjacent to the opposing sides of the semiconductor body 110 at the channel region 111, as illustrated) and also adjacent to the sidewall spacer 140 (214, see FIGS. 7A-7B). For example, a conformal high-K gate dielectric layer 161 can be deposited so as to line the gate opening 169 and one or more gate conductor layers 162 (e.g., gate metal layers) can be deposited onto the gate dielectric layer 161. Those skilled in the art will recognize that the materials and thicknesses of the dielectric and metal layers used for replacement metal gate 160 can be preselected to achieve desired work functions given the conductivity type of the FET. Exemplary high-K dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). The optimal work function for a gate conductor of an N-type FET will be, for example, between 3.9 eV and about 4.2 eV. Exemplary metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The optimal work function for a gate conductor of a P-type FET will be, for example, between about 4.9 eV and about 5.2 eV. Exemplary metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). Exemplary fill metals include, but are not limited to, tungsten and aluminum.

Figure 8A:
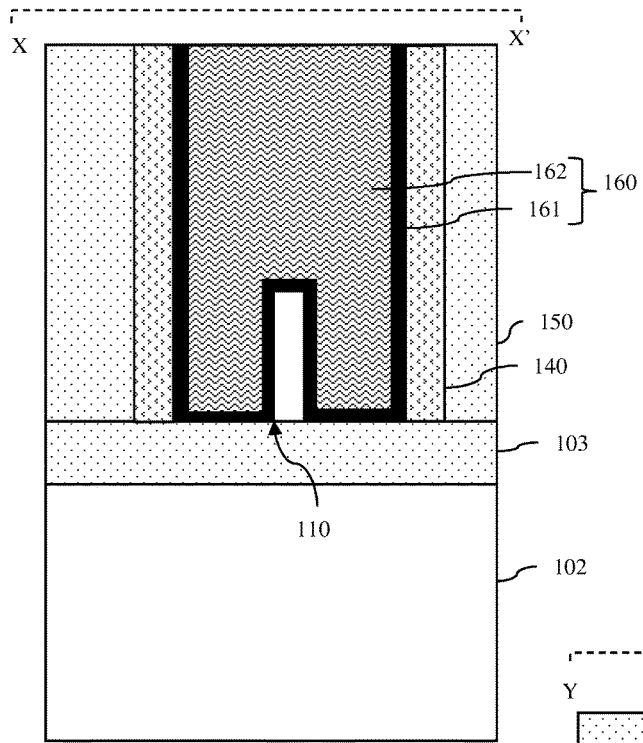
FIGS. 8A-8B are different cross-section diagrams illustrating a partially completed field effect transistor formed according to the method of FIG. 2.
Figure 8B:
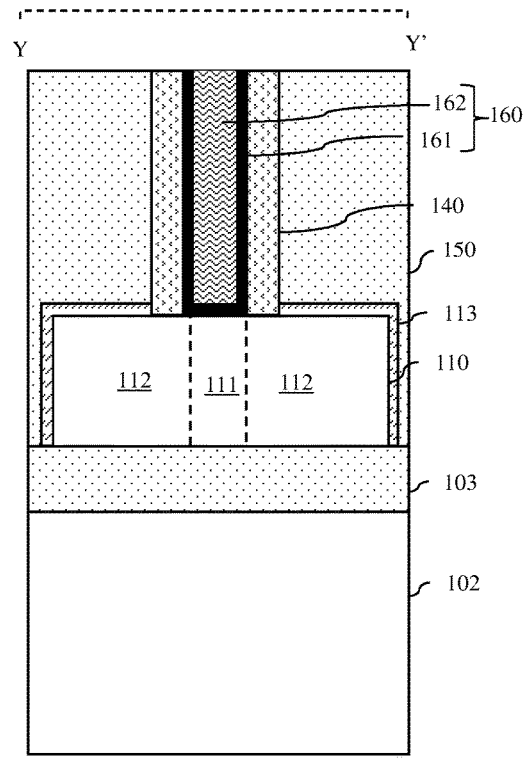

In any case, a polishing process and, particularly, a chemical mechanical polishing (CMP) process can be performed to remove the replacement metal gate materials from above the top surface 155 of the ILD layer 150 (216, see FIGS. 8A-8B). This polishing process can further be used to adjust the height of the replacement metal gate 160, as necessary. As a result of this polishing process, the top surfaces 155, 145 and 165 of the ILD layer 150, the sidewall spacer 140 and the replacement metal gate 160 will be approximately level. However, due to the nature of this polishing process (and any post-polishing cleaning process performed), these top surfaces and, particularly, the top surface 155 of the ILD layer 150 may contain micro-scratches and may also still have metal residue from the replacement metal gate thereon.

Figure 9A:
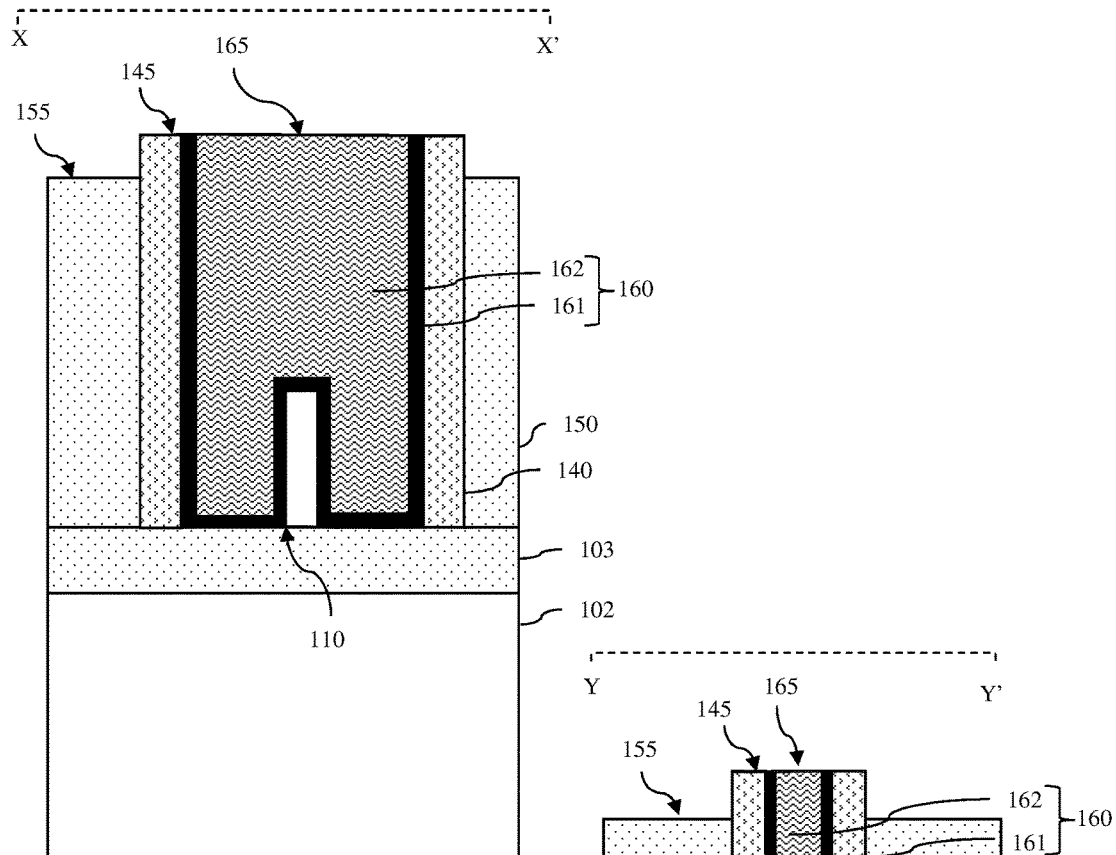
FIGS. 9A-9B are different cross-section diagrams illustrating a partially completed field effect transistor formed according to the method of FIG. 2.
Figure 9B:
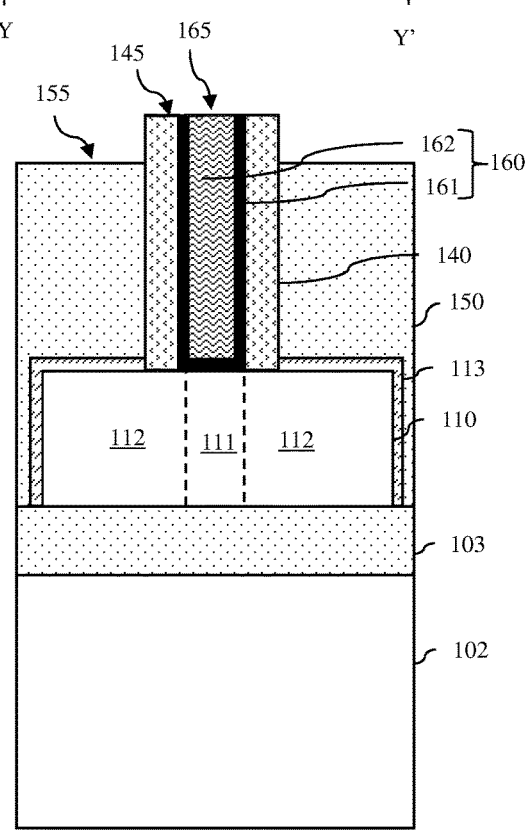

Thus, in the method embodiments disclosed herein, the top surface 155 of the ILD layer 150 can be further processed to remove any metal residue and/or micro-scratches. Specifically, the top surface 155 of the ILD layer 150 can be recessed relative to the top surface 145 of the sidewall spacer 140 and the top surface 165 of the the replacement metal gate 160 so that the distance between the semiconductor substrate 102 and the top surface of 155 of the ILD layer 150 is less than the distances between the semiconductor substrate 102 and the top surfaces 165 and 145 of the replacement metal gate 160 and the sidewall spacer 140 (218, see FIGS. 9A-9B). The recess depth can be, for example, approximately 2-4 nm and can be selectively adjusted depending, for example, upon the recess process used and/or a desired electrical characteristic (e.g., capacitance).

For example, in an embodiment of the method wherein the ILD layer 150 is a silicon dioxide ILD layer and the sidewall spacer 140 is a silicon nitride sidewall spacer or other non-oxide sidewall spacer, a chemical oxide removal (COR) process could be performed in order to recess the ILD layer 150. A COR process is typically a two-stage process. During the first stage or the reaction stage, a reaction between process gases (e.g., a mixture of hydrofluoric acid (HF) and ammonia (NH3) gases) and the silicon dioxide ILD layer results in a solid reaction product. During the second stage or the heat treatment stage, the solid reaction product is exposed to heat and evaporates. Specifications of the COR process can be predetermined to ensure the ILD layer 150 is recessed by the desired amount.

It should, however, be understood that the process used to recess the ILD layer 150 relative to the sidewall spacer 140 and the replacement metal gate 160 will vary depending upon the materials used for these different features. As mentioned above, if the ILD layer 150 is a silicon dioxide ILD layer, a COR process could be used. Alternatively, any other suitable process could be used. For example, an etch process that is selective for the silicon dioxide material of the ILD layer 150 over the various materials of the sidewall spacer 140 and replacement metal gate 160 could be used. Similarly, if the ILD layer 150 is made of some other dielectric material (e.g., BPSG, TEOS, or FTEOS, as discussed above), an etch process that is selective for the dielectric material of the ILD layer 150 over the various materials of the sidewall spacer 140 and replacement metal gate 160 could be used.

Figures 10A, 10B:
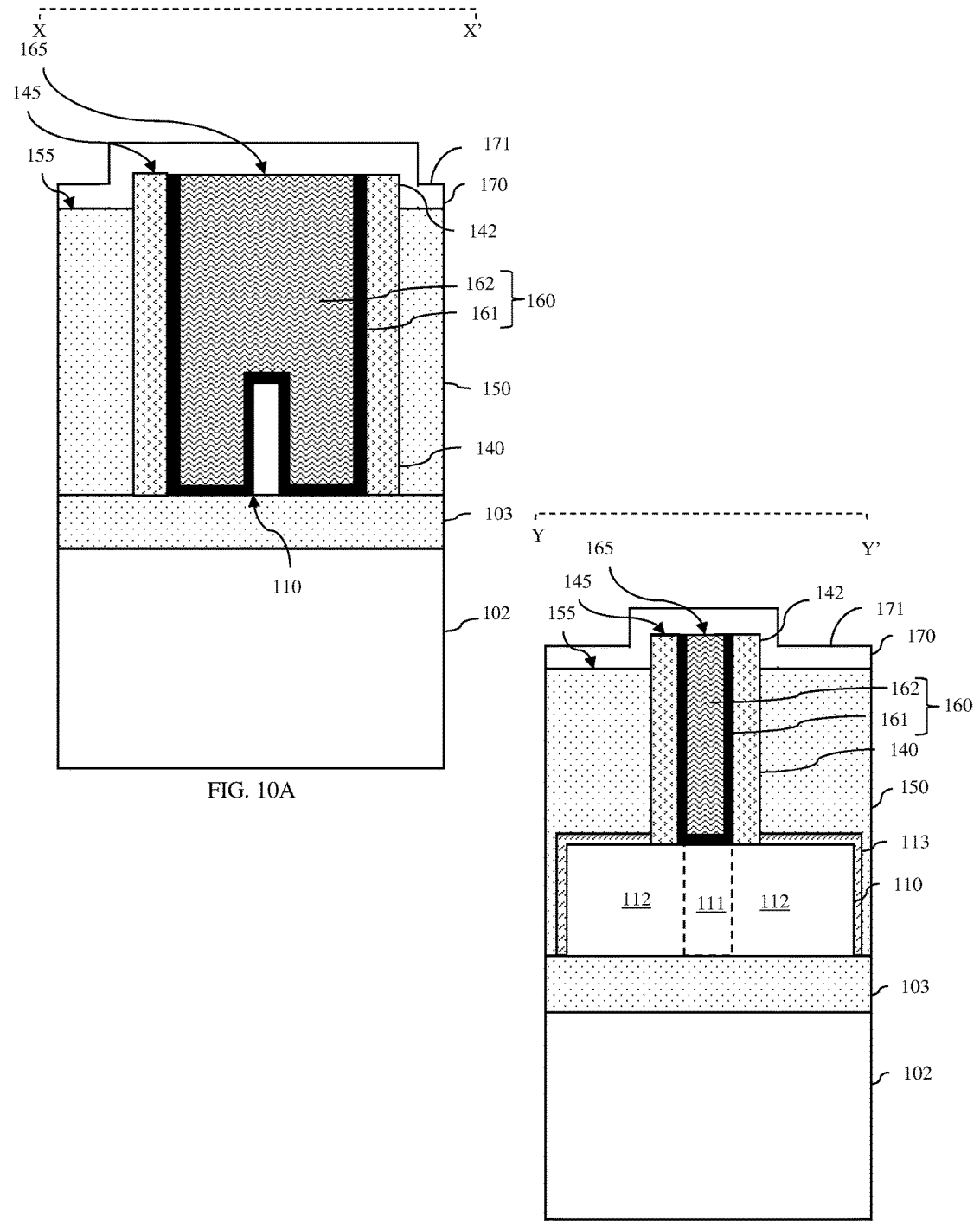
FIGS. 10A-10B are different cross-section diagrams illustrating a partially completed field effect transistor formed according to the method of FIG. 2.

Once the ILD layer 150 is recessed, a dielectric cap layer 170 can be deposited so as to cover exposed surfaces of the ILD layer 150, the sidewall spacer 140 and the replacement metal gate 160 (220, see FIGS. 10A-10B). The dielectric cap layer 170 can, for example, be conformally deposited so as to have an essentially uniform thickness, as illustrated. Alternatively, the dielectric cap layer 170 can be deposited as a blanket layer and then subsequently polished (e.g., using a chemical mechanical polishing (CMP) process) so as to have a predetermined thickness above the top surface 165 of the replacement metal gate 160 (not shown). In any case, the dielectric cap layer 170 can be a different dielectric material than the ILD layer 150. For example, the dielectric cap layer 170 can be made of silicon nitride. Alternatively, the dielectric cap layer 170 can be made of silicon carbon nitride, silicon boron carbon nitride or other suitable dielectric material. Since the top surface 155 of the ILD layer 150 was previously recessed so as to be at a lower level than the top surfaces 145 and 165 of the sidewall spacer 140 and replacement metal gate 160, respectively, the dielectric cap layer 170 will have a portion 171 that is above the ILD layer 150 and also positioned laterally immediately adjacent to (i.e., to the side of and in contact with) an outer vertical surface 142 of an upper corner of the sidewall spacer 140.

Figure 11A:
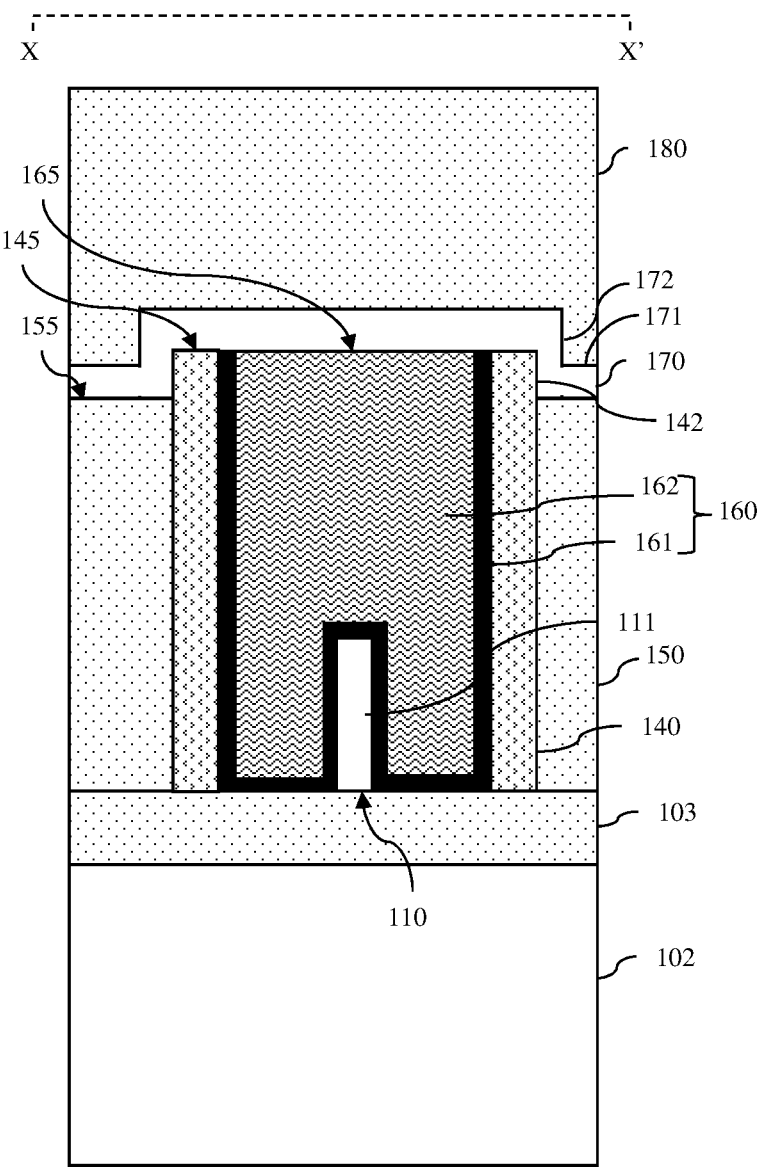
FIGS. 11A-11B are different cross-section diagrams illustrating a partially completed field effect transistor formed according to the method of FIG. 2.
Figure 11B:
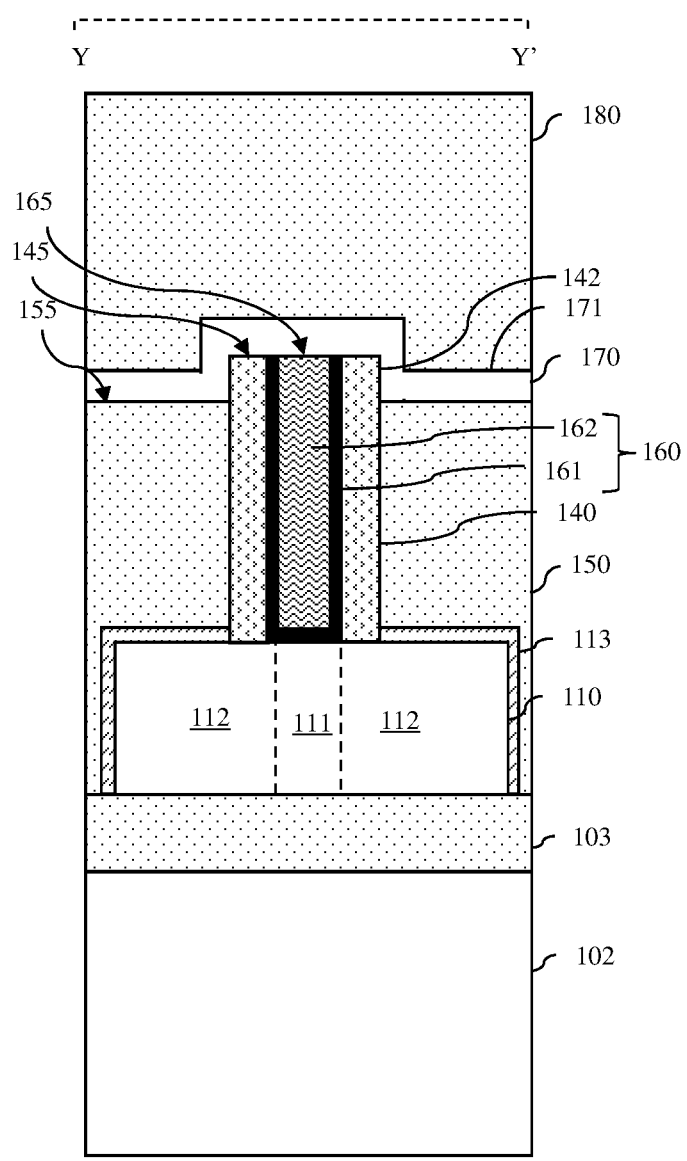

Next, an additional interlayer dielectric (ILD) layer 180 can be deposited over the dielectric cap layer 170 (222, see FIGS. 11A-11B). The additional ILD layer 180 can be a silicon dioxide ILD layer. Alternatively, the additional ILD layer 180 can be made of any other suitable ILD material (e.g., borophosphosilicate glass (BPSG), tetraethyl orthosilicate (TEOS), fluorinated tetraethyl orthosilicate (FTEOS), etc.). Yet another polishing process and, particularly, a chemical mechanical polishing (CMP) process can be performed following deposition of the additional ILD layer 180.

Then, contacts 190 to the source/drain regions 112 (or, if applicable, the raised epitaxial source/drain regions 113) can be formed (224, see FIGS. 1A-1B). Specifically, contact openings, which extend vertically through the additional ILD layer 180, the dielectric cap layer 170 and the ILD layer 150 to source/drain regions 112 (or, if applicable, the raised epitaxial source/drain regions 113) can be lithographically patterned and etched. The contact openings can, optionally, be lined with a contact liner 191 and filled with a fill metal 192, thereby forming the contacts 190. The optional contact liner 191 can be a single conformal layer (e.g., an adhesive layer or a barrier layer) that lines the contact openings or multiple conformal layers (e.g., an adhesive layer and a barrier layer on the adhesive layer) that line the contact openings. For example, the optional contact liner 191 can include a conformal titanium adhesive layer and/or a conformal titanium nitride barrier layer. Alternatively, the optional contact liner 191 can include any other suitable conformal adhesive and/or barrier layers. The fill metal 192 can be, for example, tungsten, aluminum, copper, or cobalt, or alloys thereof.

In the above-described method embodiments, since micro-scratches are removed from the top surface 155 of the ILD layer 150, electromigration of metal along the interface between the ILD layer 150 and the dielectric cap layer 170 is inhibited. Furthermore, since the top surface 155 of the ILD layer 150 is recessed so as to be at a lower level than the top surfaces 145 and 165 of the sidewall spacer 140 and replacement metal gate 160, respectively, such that the interface between the ILD layer 150 and the dielectric cap layer 170 is below the level of the top surface 165 of the replacement metal gate, movement of metal (e.g., due to electromigration or other causes) from the replacement metal gate 160 to the contacts 190 or vice versa along this interface is blocked. For example, fill metal 192 from the contacts 190 may protrude into the interface between the ILD layer 150 and the dielectric cap layer 170 through pin-hole defects in the contact liner 191; however, this fill metal 192 is blocked from contacting the replacement metal gate 160 by the outer vertical surface 142 of the sidewall spacer 140. Similarly, metal 162 from the replacement metal gate 160 may electromigrate over the sidewall spacer 140 toward the contacts 190; however, the vertical portion 172 of the dielectric cap layer 170 will block further electromigration of this metal 162.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). As used herein, the phrase "positioned laterally" refers to an element be positioned to one side of another element as opposed to above or below the other element as they are oriented in the drawings. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    removing a sacrificial gate, the removing of the sacrificial gate creating a gate opening that extends vertically through an interlayer dielectric layer and is physically separated from the interlayer dielectric layer by a sidewall spacer;
    forming a replacement metal gate in the gate opening adjacent to a channel region;
    performing a polishing process so that top surfaces of the interlayer dielectric layer, the sidewall spacer and the replacement metal gate are approximately level;
    recessing the interlayer dielectric layer relative to the sidewall spacer and the replacement metal gate;
    conformally depositing a dielectric cap layer so as to cover exposed surfaces of the interlayer dielectric layer, the sidewall spacer and the replacement metal gate, the dielectric cap layer being conformally deposited so as to have an essentially uniform thickness and so that a top surface of a portion of the dielectric cap layer on the interlayer dielectric layer is below a level of a top surface of the replacement metal gate;
    forming an additional interlayer dielectric layer on the dielectric cap layer; and
    forming an additional interlayer dielectric layer on the dielectric cap layer such that the additional interlayer dielectric layer has a non-planar bottom surface.

2. The method of claim 1, further comprising:
    forming contacts that extend vertically through the additional interlayer dielectric layer, the dielectric cap layer and the interlayer dielectric layer to source/drain regions, the channel region being positioned laterally between the source/drain regions.

3. The method of claim 1, the interlayer dielectric layer being recessed by approximately 2-4 nm.

4. The method of claim 1, the interlayer dielectric layer being recessed so as to remove any metal residue and any micro-scratches.

5. The method of claim 1, wherein, due to the recessing, electromigration of metal along an interface between the interlayer dielectric layer and the dielectric cap layer is blocked.

6. The method of claim 1, the dielectric cap layer having a portion above a top surface of the interlayer dielectric layer and positioned laterally immediately adjacent to a vertical surface of the sidewall spacer.

7. The method of claim 1, the interlayer dielectric layer and the dielectric cap layer comprising different dielectric materials.

8. The method of claim 1, the dielectric cap layer comprising a silicon boron carbon nitride layer that is immediately adjacent to an exposed top surface of the interlayer dielectric layer, an exposed top surface of the replacement metal gate, and an exposed corner of the sidewall spacer, including an exposed top surface of the sidewall spacer that is co-planar with the exposed top surface of the replacement metal gate and an exposed upper portion of one side surface of the sidewall spacer, the one side surface being positioned laterally immediately adjacent to the interlayer dielectric layer.

9. A method comprising:
    removing a sacrificial gate, the removing of the sacrificial gate creating a gate opening that extends vertically through an interlayer dielectric layer and is physically separated from the interlayer dielectric layer by a sidewall spacer, the interlayer dielectric layer comprising a silicon dioxide layer;
    forming a replacement metal gate in the gate opening adjacent to a channel region;
    performing a polishing process to adjust a height of the replacement metal gate and so that top surfaces of the interlayer dielectric layer, the sidewall spacer and the replacement metal gate are approximately level;
    recessing the interlayer dielectric layer relative to the sidewall spacer and the replacement metal gate, the recessing being performed using a chemical oxide removal process;
    conformally depositing a dielectric cap layer so as to cover and be immediately adjacent to an exposed top surfaces of the interlayer dielectric layer, an exposed top surface of the replacement metal gate, and an exposed corner of the sidewall spacer, including an exposed top surface of the sidewall spacer that is co-planar with the exposed top surface of the replacement metal gate and an exposed upper portion of one side surface of the sidewall spacer, the one side surface being positioned laterally immediately adjacent to the interlayer dielectric layer and the dielectric cap layer being conformally deposited so as to have an essentially uniform thickness and so that a top surface of a portion of the dielectric cap layer on the interlayer dielectric layer is below a level of a top surface of the replacement metal gate;
    forming an additional interlayer dielectric layer on the dielectric cap layer; and
    performing an additional polishing process such that the additional interlayer dielectric layer has a non-planar bottom surface and a planar top surface opposite the non-planar bottom surface and such that different portions of the additional interlayer dielectric layer above the replacement metal gate and above the interlayer dielectric layer have different thicknesses, respectively.

10. The method of claim 9, further comprising:
forming contacts that extend vertically through the additional interlayer dielectric layer, the dielectric cap layer and the interlayer dielectric layer to source/drain regions, the channel region being positioned laterally between the source/drain regions.

11. The method of claim 9, the interlayer dielectric layer being recessed by approximately 2-4 nm.

12. The method of claim 9, the interlayer dielectric layer being recessed so as to remove any metal residue and any micro-scratches.

13. The method of claim 9, wherein, due to the recessing, electromigration of metal along an interface between the interlayer dielectric layer and the dielectric cap layer is blocked.

14. The method of claim 9, the dielectric cap layer having a portion above the interlayer dielectric layer and positioned laterally immediately adjacent to a vertical surface of the sidewall spacer.

15. The method of claim 9, the dielectric cap layer comprising a silicon nitride layer.

16. The method of claim 9, the dielectric cap layer comprising a silicon boron carbon nitride layer.

* * * * *